(12) United States Patent
Blish, II et al.

(10) Patent No.: US 6,331,735 B1
(45) Date of Patent: Dec. 18, 2001

(54) METHOD TO IMPROVE CHIP SCALE PACKAGE ELECTROSTATIC DISCHARGE PERFORMANCE AND SUPPRESS MARKING ARTIFACTS

(75) Inventors: Richard C. Blish, II, Saratoga; Colin Hatchard, Campbell; Ian Morgan, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/161,062

(22) Filed: Sep. 25, 1998

(51) Int. Cl.$^7$ ............................ H01L 23/48; H01L 23/52; H01L 29/40
(52) U.S. Cl. .................... 257/777; 257/787; 257/778; 257/358
(58) Field of Search .................... 257/777, 355, 257/787, 788

(56) References Cited

U.S. PATENT DOCUMENTS

| | | | |
|---|---|---|---|
| 5,590,460 | 1/1997 | DiStefano et al. | 29/830 |
| 5,597,470 | 1/1997 | Karavakis et al. | 205/118 |
| 5,629,239 | 5/1997 | DiStefano et al. | 216/14 |
| 5,679,194 | 10/1997 | Fjelstad et al. | 156/150 |
| 5,763,941 | 6/1998 | Fjelstad | 257/669 |
| 5,956,605 | * 9/1999 | Akram et al. | 438/613 |
| 6,011,300 | * 1/2000 | Muramatsu | 257/668 |
| 6,023,028 | * 2/2000 | Neuhalfen | 174/250 |
| 6,046,507 | * 4/2000 | Hatchard et al. | 257/790 |
| 6,093,971 | * 7/2000 | Oppermann et al. | 257/783 |

FOREIGN PATENT DOCUMENTS

| | | | |
|---|---|---|---|
| 61-176165 | * 8/1986 | (JP) | 257/787 |
| 1-69039 | * 3/1989 | (JP) | 257/784 |

* cited by examiner

*Primary Examiner*—Eddie C. Lee
*Assistant Examiner*—Jhihan B. Clark
(74) *Attorney, Agent, or Firm*—Sawyer Law Group LLP

(57) ABSTRACT

The present invention is a method for providing chip scale package. The method of the present invention includes providing a die with a first side, a second side, and a plurality of edges; applying a substance which protects against electrostatic discharge to the first side of the die and to the plurality of edges; and providing components on the second side of the die. The method of the present invention protects the chip scale package from electrostatic discharges. Markings may also be placed on the substance without damaging the chip in the package.

2 Claims, 5 Drawing Sheets

METHOD TO IMPROVE CHIP SCALE PACKAGE ELECTROSTATIC DISCHARGE PERFORMANCE AND SUPPRESS MARKING ARTIFACTS

FIELD OF THE INVENTION

The present invention relates to microprocessors, and more particularly to the manufacturing of chip scale packages.

BACKGROUND OF THE INVENTION

Chip scale packages of microprocessors are sensitive to electrostatic discharges. How well they are protected from electrostatic discharges is an important concern. "Chip scale packages", as used in this application, refers to packages in which the carrier on which the chip sits is approximately the same size as the chip. FIG. 1 illustrates a cross-section of a chip scale package manufactured with a conventional method Tessara BGA®. The package 100 includes a chip 110 with a die 120. The die 120 is conventionally composed of a silicon material. The die 120 has a front side 10 and a back side 20. The circuitry (not shown) of the chip 110 is located on the face of the front side 10. The package 100 also includes a carrier (tape) 130 with an array of balls 140 connected to the front side 10 of the chip 110. The balls 140 are soldered to a carrier, in this example a printed circuit board (PCB) 150. The array of balls 140 facilitates the connections between the circuitry on the die 120 and the substrate 150. To facilitate the connections between the die 120 and the balls 140, wires or tabs 160 are connected therebetween via bonding pads 170.

FIG. 2 is a flow chart illustrating a conventional method of manufacturing a chip scale package. Referring to FIGS. 1 and 2 together, first, the conventional wafer fabrication process is performed, via step 202. The wafer is manufactured with a Silicon die 120. The back side 20 of the die 120 is mounted on a tacky plastic tape, via step 204. Using a thin diamond saw, columns and rows of cells are sawed from the front side 10 of the die 120 completely through the Si and into the tacky plastic, via step 206. Then, a carrier tape with chip components (balls and a fan-in pattern of connections between the balls and the chip) such as the one developed by Tessara, Inc., are placed on the front side of the die 120, via step 208. The tape manufactured by Tessara is well known in the art and will not be further described here. A bonding tool is used to bond the wires or tabs 160 to the bonding pads 170, via step 210. With a needle-like tool, viable portions of the die 120 with carrier tape are ejected from the tacky plastic, via step 212. This leaves non-viable portions of the die 120 attached to the tacky plastic. Good dice and bonded carrier tape are place in tray, via step 214, retaining viable portions of the die 120 on the chip 110 while leaving non-viable portions on the tacky plastic. The tape and the non-viable portions of the die 120 are then thrown away. Data may be marked on the back side 20 of the die 120, via step 216. The data may include information such as the lot number, part number, and the speed of the chip 110. The resulting chip 110 has viable die with carrier, balls, and other components attached, as shown in FIG. 1. This chip 110 is then mounted onto a printed circuit board 150, via step 218, to form the final chip scale package 100.

A problem with the conventional method of manufacturing a chip scale packaging 100 related to the fact that the back side 20 of the die 120 is exposed to many environmental factors. The exposed die renders the chip 110 particularly sensitive to possible electrostatic discharge (ESD). ESD can damage the chip 110 in two ways. First, the exposed die 120 can come in contact with a charged object which discharges to the chip 110. This is commonly referred to as the human body model (HBM). Second, the exposed die 120 may come in close proximity to a highly charged body, which induces a charge in the chip 110. This is commonly referred to as the charge device model (CDM). In both models, a high current occurs in the chip 110 for a short period of time, which damages one or more active areas of the chip 110. Thus, the package 100 manufactured with the conventional method is thus particularly sensitive to ESD.

Another problem with the conventional method of manufacturing a chip scale package 100 involves the marking of the package 100 on the back side 20 of the die 120. Infrared (IR) Lasers are often used to write this data directly into the die 120. However, the laser IR travels through the silicon die 120 since silicon is transparent to infrared light (not true of green light). When the light reaches the balls 140 on the front side 10 of the die 120, which are typically composed of Aluminum or some other metal, the light's energy are deposited on the balls 140 since metals are not transparent to infrared light. This energy causes local melting of the Aluminum metal patterns of the balls 140, damaging the chip 110.

Accordingly, there exists a need for a method of manufacturing a chip scale package which will provide protection against electrostatic discharge and allow the writing of data using an infrared laser onto the chip in the package without causing damage. The present invention addresses such a need.

SUMMARY OF THE INVENTION

The present invention is a method for providing chip scale package. The method of the present invention includes providing a die with a first side, a second side, and a plurality of edges; applying a substance which protects against electrostatic discharge to the first side of the die and to the plurality of edges; and providing components on the second side of the die. The method of the present invention protects the chip scale package from electrostatic discharges. High contrast, colored markings may also be placed on the substance without damaging the chip in the package.

DETAILED DESCRIPTION

The present invention provides an improved method of manufacturing a chip scale package. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 3:
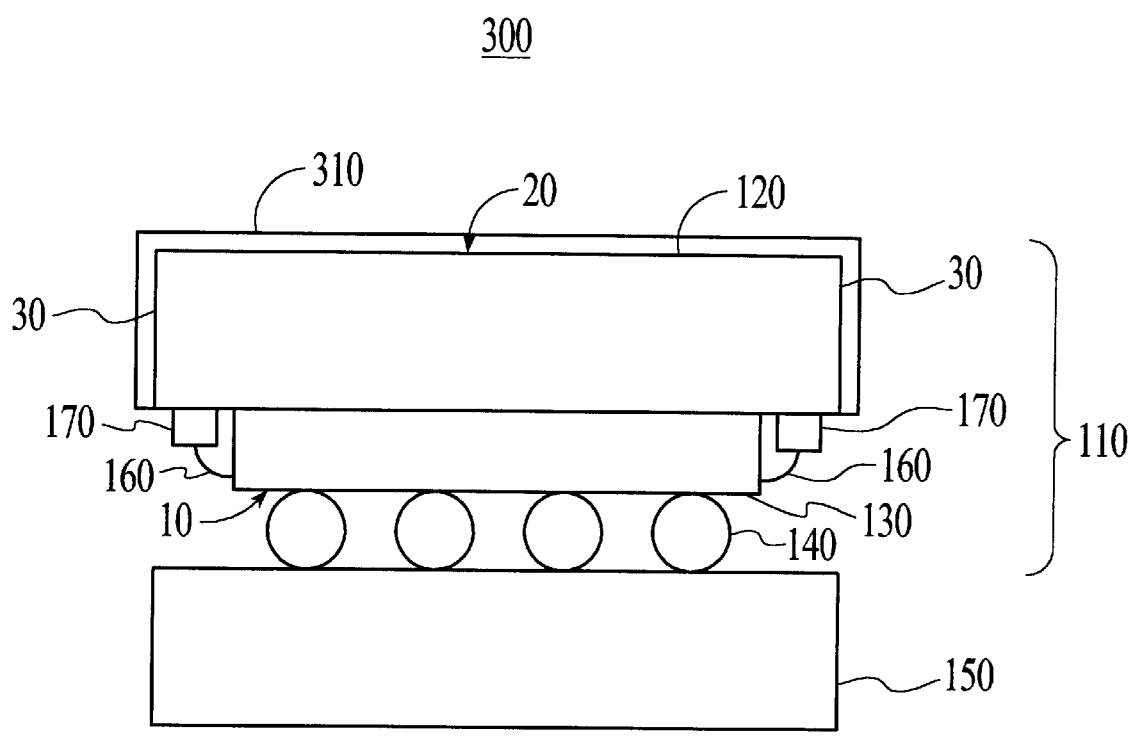
FIG. 3 is an illustration of a chip scale package manufactured with a method in accordance with the present invention.

The method according to the present invention provides a chip scale package with protection against electrostatic discharge (ESD) and allows data to be written onto the chip in the package without causing damage. FIG. 3 illustrates a chip scale package 300 manufactured with a method in accordance with the present invention. The package 300 is the same as the package 100 except for a layer of a substance 310 on the back side 20 and edges 30 of the die 120. In a preferred embodiment, this substance would comprise an electrophoretic paint. An example of an electrophoretic paint which may be used is Enthone Clearlyte HB. The method of the present invention takes advantage of the conductive properties of the die 120 to coat the back 20 and edges 30 of the die 120 with the substance 310 which provides protection from ESD. Data may be written onto the substance 310 without causing damage to the chip 320.

To more particularly describe the features of the present invention, please refer to FIGS. 4 and 5 in conjunction with the discussion below.

Figure 4:
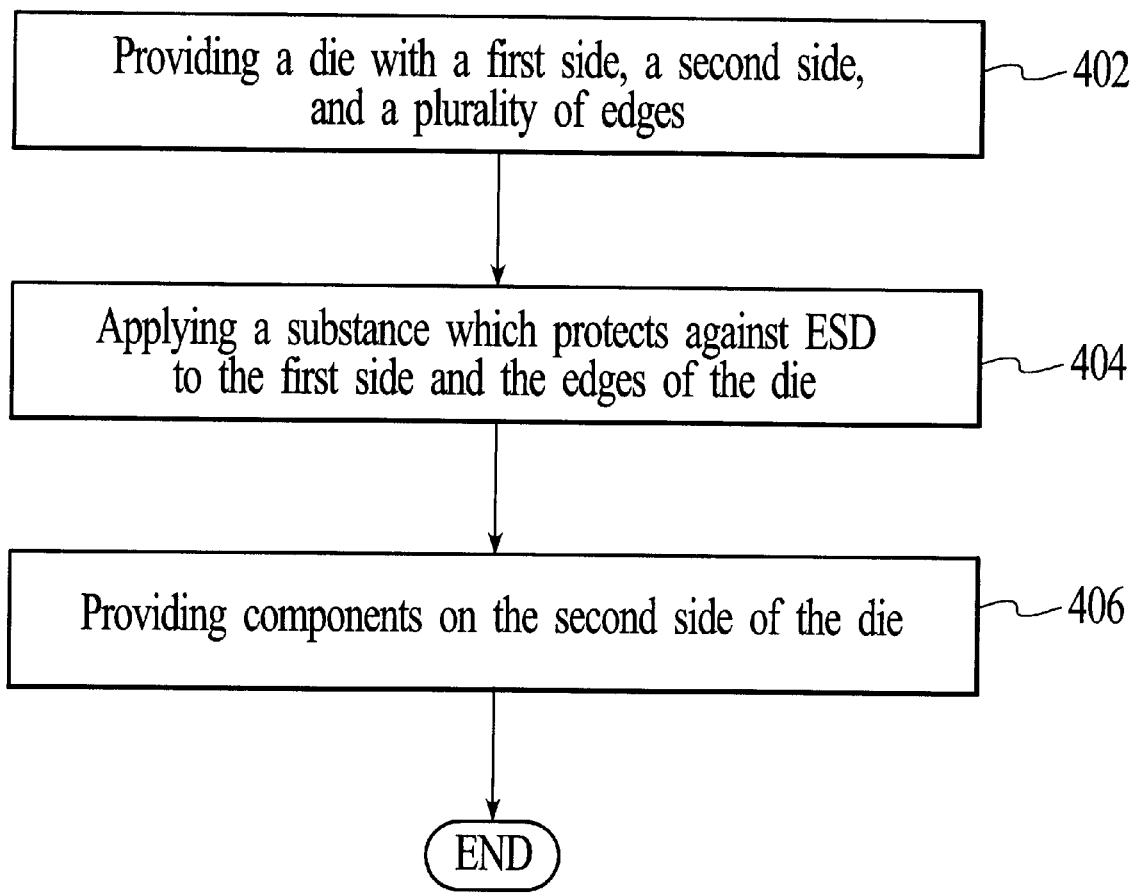
FIG. 4 is a flow chart illustrating a preferred embodiment of the method of manufacturing a chip scale package in accordance with the present invention.

FIG. 4 is a flow chart illustrating a preferred embodiment of the method of manufacturing a chip scale package in accordance with the present invention. The method begins with providing a die with a first side, a second side, and a plurality of edges, via step 402. Electrophoretic paint 310 is then applied to the first side and the edges of the die, via step 404. Then, components are provided on the second side of the die, via step 406.

Figure 5:
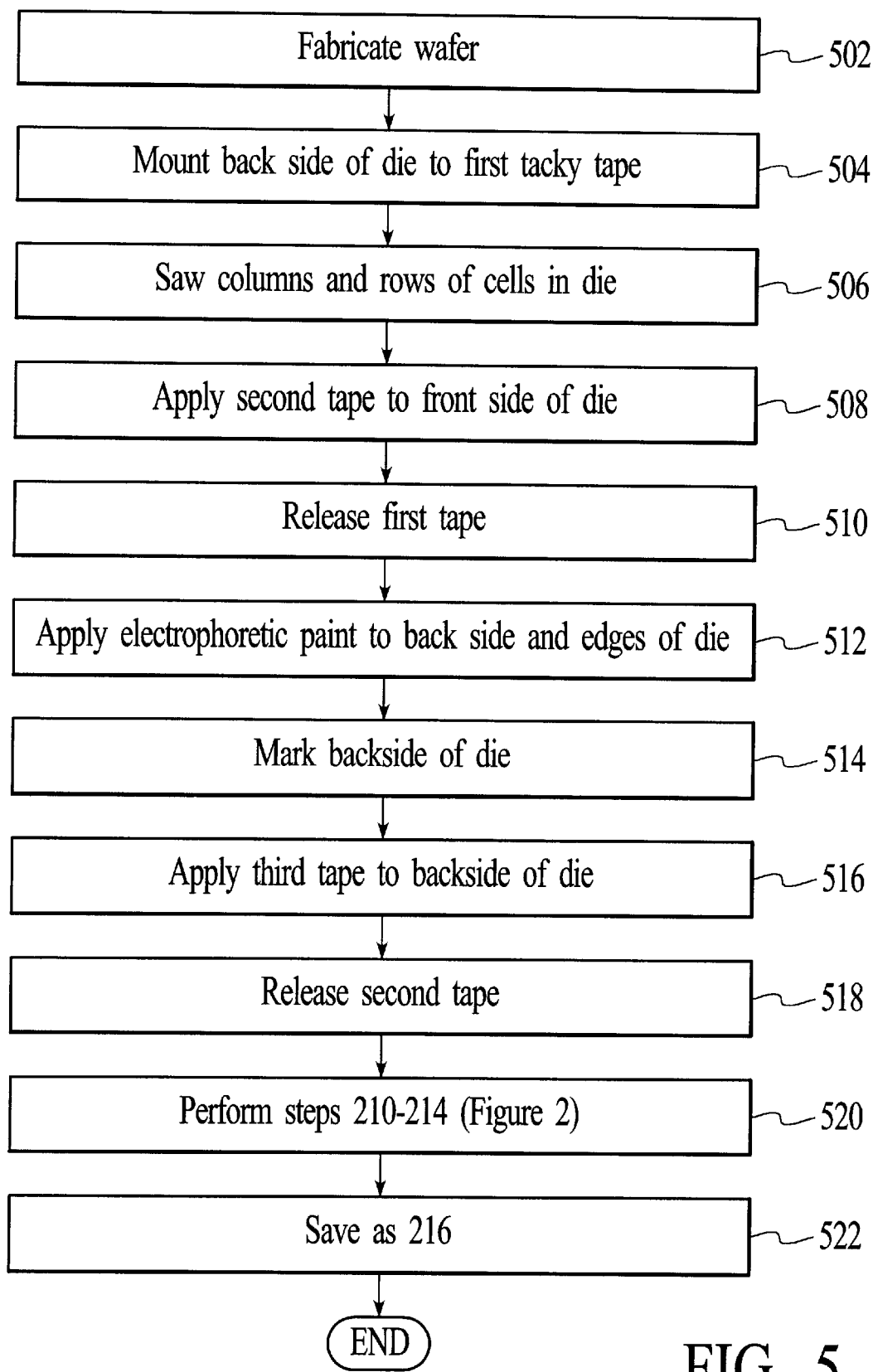
FIG. 5 is a flow chart illustrating in more detail the preferred embodiment of the method of manufacturing a chip scale package in accordance with the present invention.

FIG. 5 is a flow chart illustrating in more detail the preferred embodiment of the method of manufacturing a chip scale package 300 in accordance with the present invention. In this embodiment, the first side is the back side 20 of the die 120, and the second side is the front side 10. It begins with the manufacturing of the wafer using conventional fabrication processes, via step 502. The wafer has a Silicon die 120. The die 120 is mounted on a first tape, such as an ultraviolet light releasable tape manufactured by Furakawa, with the back side 20 of the die 120 on the first tape, via step 504. The front side 10 of the die 120 is sawed to form the columns and rows of cells, via step 506. The die 120 is then transferred to a second tape with the front side 10 on the second tape, via step 508. The first tape is released using ultraviolet light, via step 510. With the back side 20 and edges 30 of the die 120 exposed, a layer of electrophoretic paint 310 is applied, via step 512. Since die 120 is conductive, the electrophoretic paint 310 will coat the entire back side 20 and edges 30. Preferably, the second tape has conductive properties which will facilitate the coating. This layer of electrophoretic paint 310 protects the die 120 from ESD.

After the application of the paint 310, if desired, markings may be placed on the paint 310 at the back side 20, via step 514. Since the high contrast or colored markings are placed on the paint 310 rather than on the die 120, no damage to the die 120 occurs.

Figure 1:
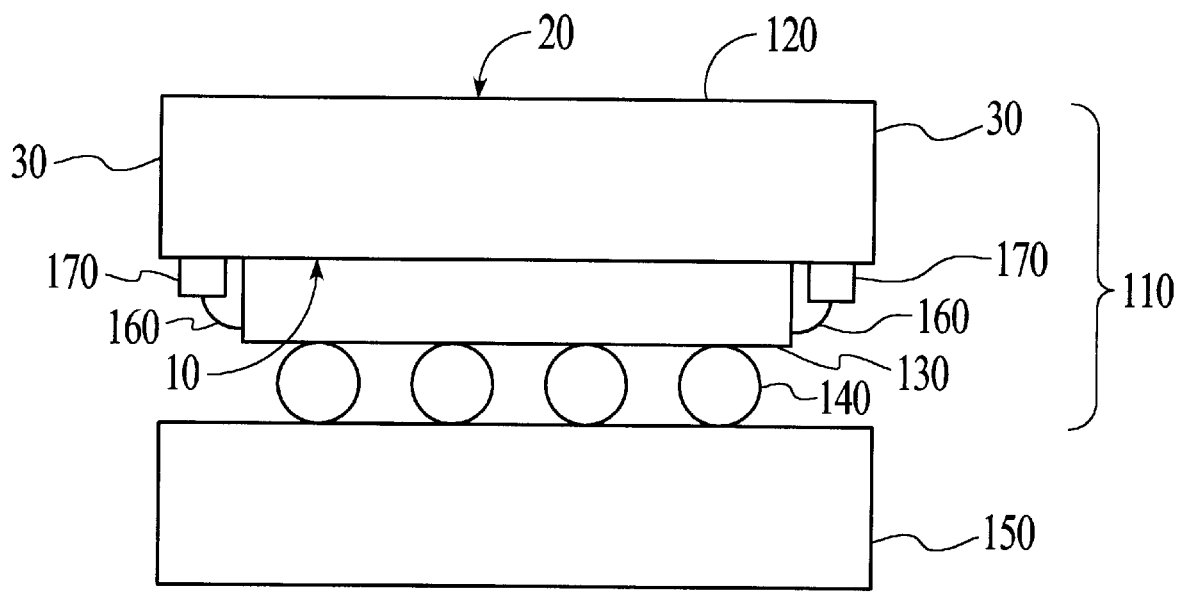
FIG. 1 is an illustration of a chip scale package manufactured with a conventional method.
Figure 2:
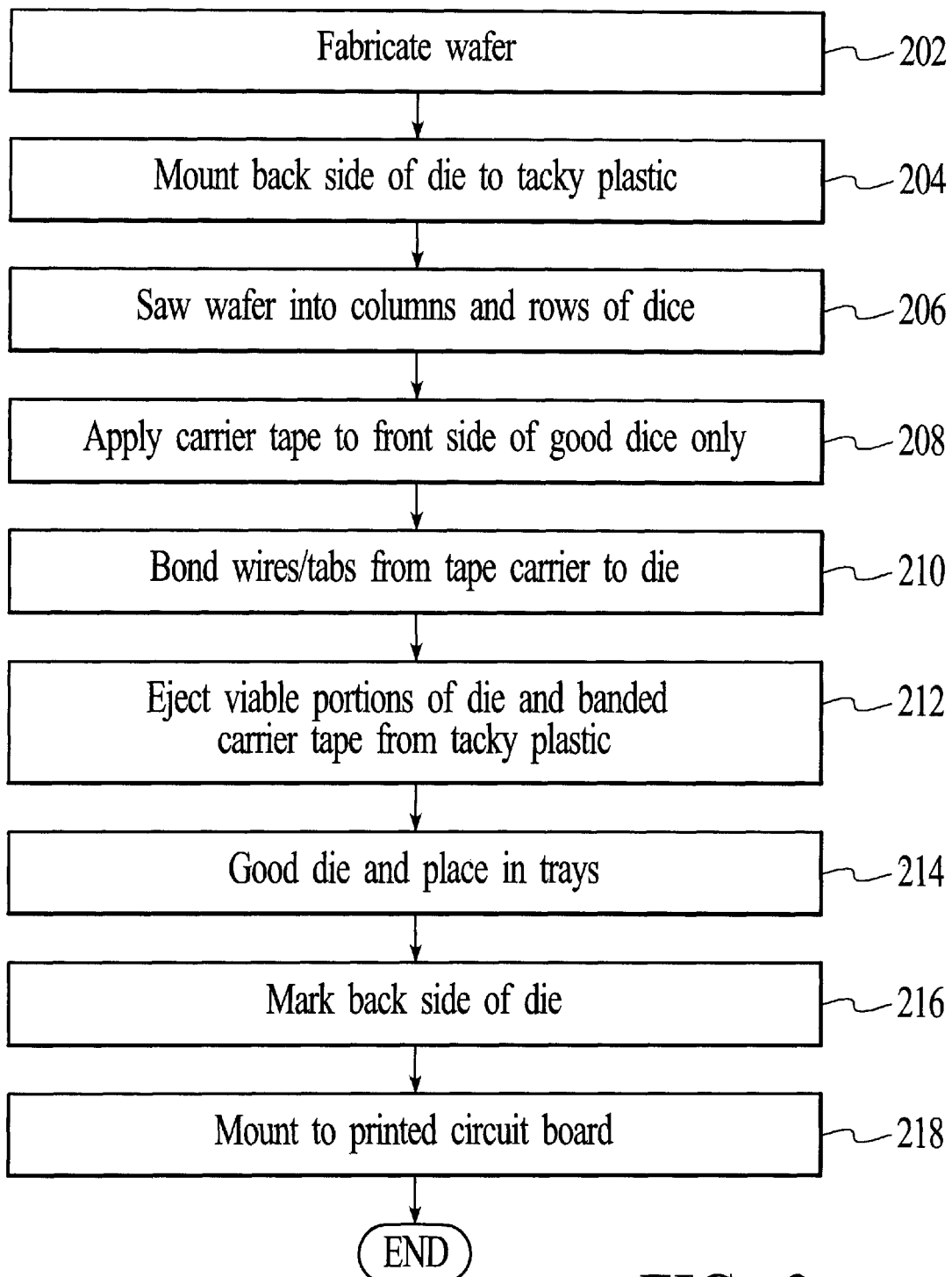
FIG. 2 is a flow chart illustrating a conventional method of manufacturing a chip scale package.

The die 120 is then transferred to a third tape on the back side 20 on the third tape, via step 516. The second tape is then released, via step 518. The conventional tape with balls and the fan-in pattern is then applied to the front side 10 of the die 120, via step 520. The remainder of the chip 320 is then manufactured using conventional steps 210 through 216 (FIG. 2), via step 520. The chip 320 is then mounted onto the printed circuit board 150, via step 522.

An improved method for manufacturing a chip scale package has been disclosed. This method in accordance with the present invention coats the back side and edges of the die with a substance which protects the chip scale package from electrostatic discharges. Markings may also be placed on the substance without damaging the chip in the package.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A chip scale package, comprising:
   (a) a die with a first side, a second side, and a plurality of edges;
   (b) an electrophoretic substance which protects against electrostatic discharge on the first side of the die and on the plurality of edges but not on the second side of the die; and
   (c) components on the second side of the die.

2. A chip scale package, comprising:
   (a) a die with a first side, a second side, and a plurality of edges;
   (b) an electrophoretic substance which protects against electrostatic discharge on the first side of the die and on the plurality of edges but not on the second side of the die, wherein data is written on the substance without damaging the die; and
   (c) components on the second side of the die.

* * * * *